US006210545B1

United States Patent
Farooq et al.

(10) Patent No.: US 6,210,545 B1
(45) Date of Patent: Apr. 3, 2001

(54) METHOD FOR FORMING A PEROVSKITE THIN FILM USING A SPUTTERING METHOD WITH A FULLY OXIDIZED PEROVSKITE TARGET

(75) Inventors: Mukta Farooq, Hopewell Junction; Robert A. Rita, Wappinger Falls; Stephen M. Rossnagel, Pleasantville, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/447,626

(22) Filed: Nov. 23, 1999

(51) Int. Cl.[7] .......................... C23C 14/34; C04B 41/87; C04B 35/465; C04B 35/468
(52) U.S. Cl. .............................. 204/192.22; 204/192.15; 204/192.17; 264/61; 264/65; 264/66; 427/123; 427/77; 427/78; 427/126.3; 427/377; 501/136; 501/137; 501/134; 501/135
(58) Field of Search .................. 204/192.22, 192.15, 204/192.17; 264/61, 65, 66; 427/123, 77, 78, 126.3, 377; 501/136, 137, 134, 135

(56) References Cited

U.S. PATENT DOCUMENTS

| 5,520,785 |   | 5/1996 | Evans et al. . |           |
|-----------|---|--------|----------------|-----------|
| 5,626,728 | * | 5/1997 | Ramakrishnan et al. | 204/192.22 |
| 5,658,612 |   | 8/1997 | Li et al. .    |           |
| 5,672,378 |   | 9/1997 | Maher .        |           |
| 5,733,685 |   | 3/1998 | Wang .         |           |
| 5,800,683 | * | 9/1998 | Kammerdiner et al. | 204/192.22 |

OTHER PUBLICATIONS

Pratt et al., "Fabrication of rf–Sputtered Barium Titanate Thin Films," The Journal of Vacuum Science and Technology, vol. 8, No. 1, pp. 256–260, Jan.–Feb., 1971.*

* cited by examiner

Primary Examiner—Alan Diamond
(74) Attorney, Agent, or Firm—Rosenman & Colin LLP

(57) ABSTRACT

An inventive method for forming a thin film comprises the steps of preparing a sputter-target of a material which is fully oxidized and crystallized to a perovskite structure, sputter-depositing a thin film on top of a sample with the target in an inert gas atmosphere, and annealing the thin film in non-oxygen ambient. With the use of such a target, it is possible to reduce the negative ion effect during the sputter deposition and to eliminate the presence of oxygen during the annealing process.

17 Claims, 5 Drawing Sheets

FORMING A SPUTTER TARGET OF A MATERIAL FULLY OXIDIZED PEROVSKITE

↓

DEPOSITING PEROVSKITE THIN FILM WITH SAID SPUTTER TARGET

↓

ANNEALING THE PEROVSKITE THIN FILM IN NON-OXYGEN AMBIENT

METHOD FOR FORMING A PEROVSKITE THIN FILM USING A SPUTTERING METHOD WITH A FULLY OXIDIZED PEROVSKITE TARGET

FIELD OF THE INVENTION

The present invention relates to a method for forming a perovskite thin film; and, more particularly, to a method for sputter-depositing the perovskite thin film using a fully oxidized perovskite target, thereby eliminating oxygen negative ion effects and allowing an annealing process to be carry out in a non-oxygen ambient.

BACKGROUND OF THE INVENTION

High permittivity materials are characterized by a dielectric constant, R, of 100 or more, well above that of conventional dielectrics, such as silicon dioxide (R=4). A large class of materials with high permittivity is known as the titanates, and the most widely used material in this class is $BaTiO_3$, or barium titanate. The general class of materials has an $ATiO_3$ chemistry, where "A" is typically Ba, but may also be a similar element from the periodic table. Variations on this chemistry have been developed which have minor or part substitutions for the Ba or the Ti, while retaining the same overall structure. An example of a partial Ba substitution is Barium Strontium Titanate (BST), in which approximately 10–15% of the Ba is replaced with Sr. An example of partial Ti substitution is Barium Zirconate Titanate (BZT), in which about 15% of the Ti is replaced with Zr. These substitutions may result in enhancement of either the dielectric constant or the polarizability of the material.

The titanates all have a perovskite crystalline structure, which is a widely known variation of a cubic lattice. However, this particular crystal structure is not known to form at low temperatures, and typically does not form until the material has been raised to at least 650° C. This means that virtually all fabrication techniques for titanates require an annealing step at 650° C. or higher to form the desired perovskite structure and the high dielectric constant.

Titanate films can be deposited by various conventional techniques, such as chemical vapor deposition (CVD), physical vapor deposition (PVD), sol-gel techniques, or pulsed-laser deposition (PLD), and then this titanate film is annealed to form the desired perovskite structure and also to ensure adequate oxygen levels within the deposited high permittivity material. This application relates to the physical sputtering techniques and the annealing process to form high permittivity films of materials such as the titanates.

First, sputter-deposition techniques fall into two classes; diode sputtering and ion beam sputtering. This application is related primarily to diode sputtering, which in practical usage constitutes either rf diode or magnetron sputter deposition. Ion beam sputtering is characterized by fairly low deposition rates and a moderate degree of complexity for the ion beam system, and hence has fairly little application in large area, high rate, or manufacturing scale operations.

Diode sputtering systems include a cathode and an anode in a vacuum system. A plasma is formed between the electrodes following the application of a suitably high dc or rf potential between the electrodes. Ions from the plasma bombard the cathode causing physical sputtering, which results in film deposition on nearby surfaces. This technology is known widely as sputter deposition. The addition of specialized magnetic fields to the cathode can enhance the sputtering and deposition rates, and cathodes of this type are widely known as magnetrons. Diode sputtering is widely used for the deposition of metallic films, and can also be used for the reactive deposition of compound films when sputtering is performed in the presence of a reactive gas species.

A fundamental problem has been observed when sputtering materials in the titanate class. This problem has also been observed when sputtering other perovskite materials, such as the high temperature superconductors (yttrium-barium-copper-oxides and related materials). During the sputtering process from a composite target, negative oxygen ions are formed at the cathode surface. This is thought to be due to the high electron affinity for oxygen and also the presence of species, such as Barium, which are prone to giving up an electron. This effect is widely observed with conventional PVD composite targets. The composite targets are formed by hot-pressing mixed powders of the appropriate oxides into disks. For example, a barium-titanate sputter-target would be formed by making a mixture of barium oxide and titanium oxide articles, and hot-pressing them into a disk shape which is then bonded to a target plate.

Once the oxygen negative ion is formed at the cathode surface, it is accelerated into the plasma by means of the cathode dark-space or sheath. This is a similar process to the acceleration of secondary electrons into the plasma from the cathode. As the oxygen negative ion crosses the cathode sheath, it attains a kinetic energy equal to the cathode potential and then enters the plasma. Its trajectory is normal to the cathode surface. Once in the plasma, the extra electron on the oxygen negative ion is stripped by the background plasma, and the oxygen ion becomes a neutral atom. However, it is still moving with high energy away from the cathode.

Most deposition systems place the sample-to-be deposited-on at a location opposite the cathode with a cathode-to-sample distance of perhaps 5–25 cm. The energetic oxygen neutral atom crosses through the plasma and can bombard the sample surface with considerable energy, leading to the sputtering (or 're-sputtering') of the deposited film on the sample surface. This resputtering process has several drawbacks. First, it results in a significant reduction in the net deposition rate at the sample position as the energetic neutral oxygen atoms bombard the film surface. Second, since the sputtering rate varies depending on the material being sputtered, the energetic neutral resputtering of the film surface may preferentially remove atoms with high sputter yields from the depositing film, altering its chemical stoichiometry. The result of these two processes is to significantly degrade the sputter deposition rate and to deposit a film which has a stoichiometry which is different from the cathode being sputtered.

The effect of negative ion-energetic neutral re-sputtering is also exaggerated by the presence of additional oxygen atoms in the plasma discharge chamber. Often when materials such as the titanates are sputtered, additional oxygen must be added to the deposition chamber to help deposit the films in a more completely oxidized state. The added oxygen from the gas phase can lead to additional negative ion formation at the cathode and increased bombardment of the deposited film by negative ions. Several reports have been published which show significant etching due to negative ion effects when sputtering titanate or high temperature perovskite superconductors.

There are only two known solutions to this problem, prior to the current application. The first utilizes very high gas pressures during sputtering. Typical pressures used are many hundreds of milli Torr, where typically sputtering would normally operate at a few to 30 or so milli Torr. The high gas pressure slows the energetic negative ions/neutrals by gas phase collisions and this reduces the problem of re-sputtering. The deposition rate, however, is strongly reduced by the high pressure, and this solution is then inappropriate for manufacturing applications.

Further, all deposition technologies for high permittivity materials utilize a high temperature annealing step in oxygen. The standard technique is to anneal the films for a period of a minute or so up to several hours in a background of oxygen, air or some other oxidizing ambience. Generally, the dielectric constant achieved is related to the temperature of the anneal. For example, an anneal of BZT to a temperature of 650° C. has been observed to lead to a dielectric constant of up to 300–330. The same film, when annealed to 900° C. leads to a dielectric constant of 550–600.

This oxidizing, high temperature anneal may cause significant problems with other materials which may be part of the sample substrate because these materials may also be oxidized. It may also cause structural problems, as the physical dimensions of the material may change as it is oxidized, causing expansion or contraction of underlying features on the sample.

To prevent oxidation, oxygen diffusion barriers have been used to protect underlying features. Typical diffusion barriers might include TiN, TaN or TaSiN, each of which may have slight stoichiometric permutations. However, all known diffusion barriers have been found to fail in the presence of oxygen as the temperature exceeds approximately 700° C.

The failure of the diffusion barrier severely limits the optimization of the dielectric constant. It may also prove limiting to the optimization or minimization of the losses in the dielectric, which have been observed to be reduced by annealing in oxygen.

SUMMARY OF THE INVENTION

It is, therefore, a primary object of the present invention to provide a method for sputter-depositing the perovskite thin film using a fully oxidized perovskite target, thereby eliminating oxygen negative ion effects, allowing an annealing process to be carry out in the non-oxygen ambient.

In accordance with one aspect of the present invention, there is provided a method for sputterdepositing a perovskite thin film, the method comprising the step of: forming a sputter-target of a material which is a fully oxidized perovskite; depositing a perovskite thin film on top of a substrate by using a sputtering method with said sputter-target in an inert gas; and annealing the perovskite thin film in a non-oxygen ambient.

BRIEF DESCRIPTION OF THE DRAWINGS

The above and other objects and features of the present invention will become apparent from the following description of the preferred embodiments given in conjunction with the accompanying drawings, wherein.

DETAILED DESCRIPTION OF THE PREFERRED EMBODIMENTS

A means for reducing the deleterious effects of the oxygen annealing step required for high quality perovskite thin film is to eliminate the presence of oxygen during the annealing process. This can only be done, though, if the perovskite thin films are fully oxidized prior to the annealing step. Sputter deposition from conventional targets, however, in the presence of added oxygen leads to additional negative ion formation which results in either alteration of the film stoichiometry due to resputtering or a strong reduction in the deposition rate of the film by resputtering.

The principles of the present invention will be described and illustrated using the formation of Barium zirconate titanate thin film.

Figure 1:
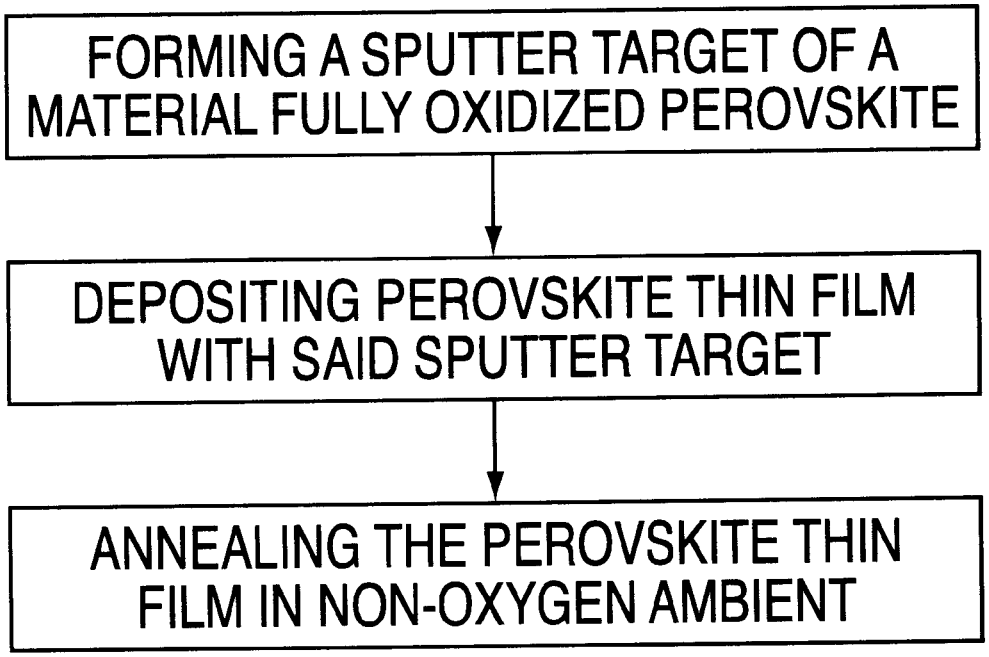
FIG. 1 is a block diagram illustrating a method for forming a perovskite thin film in accordance with the present invention.

FIG. 1 is a block diagram setting forth a method for sputter-depositing a perovskite thin film, e.g., barium zirconate titanate(BZT) thin film, capable of solving the above problems in accordance with the present invention.

Figure 2:
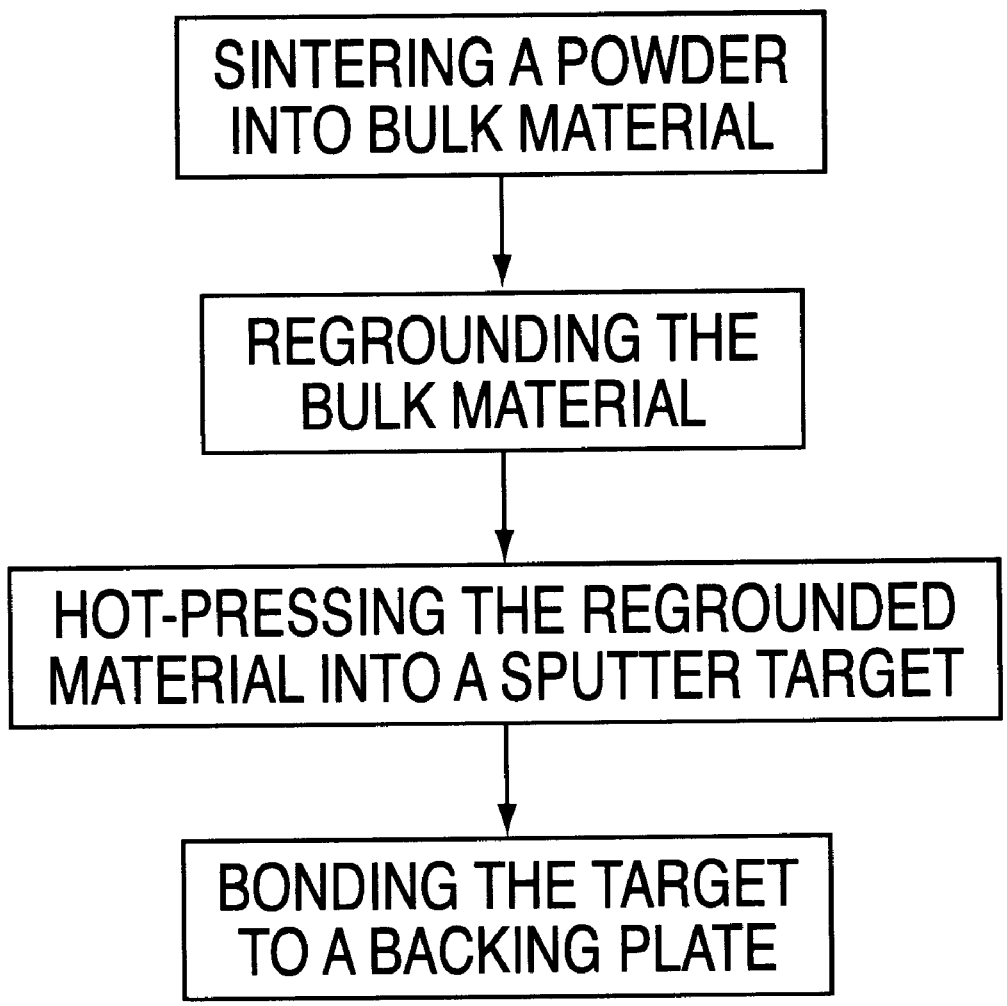
FIG. 2 is a block diagram setting forth a method for forming a sputter-target in accordance with the present invention.

The process for sputter-depositing the BZT thin film begins with the formation of a sputter-target which is fully oxidized and crystallized to have a perovskite structure to reduce or potentially eliminate the presence of negative ions during sputtering and all of the ancillary problems. As shown in FIG. 2, this sputter-target is specially formed by the steps described herebelow.

The first step in forming the BZT sputter-target is to sinter the powders which are typically used to form the conventional composite target at temperatures of over 900° C. in the presence of oxygen. This leads to the formation of bulk BZT which is fully oxidized and has the desired perovskite crystal structure.

Next, the bulk BZT is reground into a powder although it retains its perovskite crystal structure and then hot pressed in an inert ambient, e.g., nitrogen or argon, into the form of a disk. This fabrication step does not alter the microstructure of the film crystallites forming the BZT target, but tends to bind the BZT together as a near-bulk-density composite.

Then, the disk is bonded to a conventional sputter-target backing plate prior to usage in the sputtering system.

Figure 3:
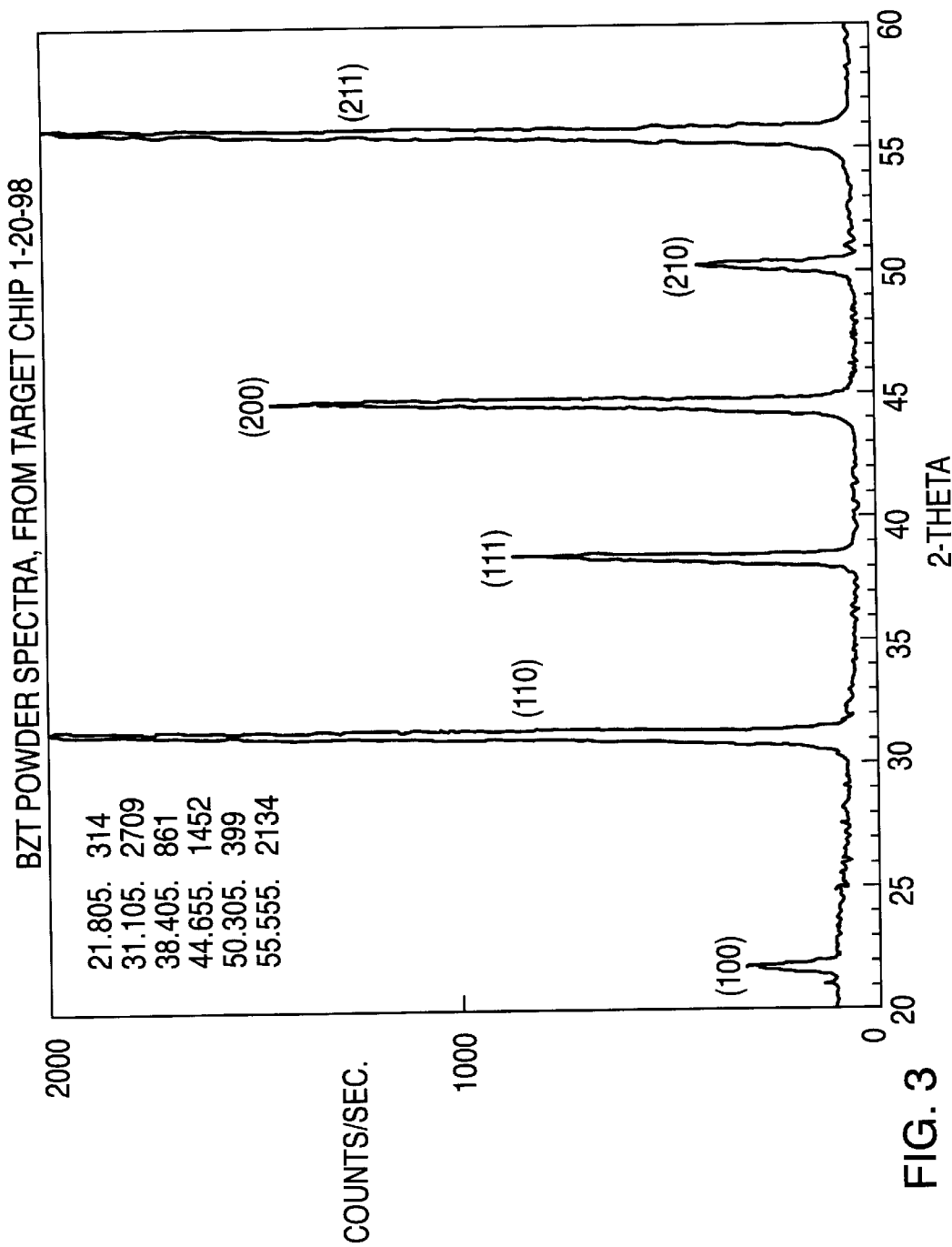
FIG. 3 is a plot presenting XRD two-theta trace of the powder taken from the BZT sputter-target in accordance with the present invention.

FIG. 3 is a plot of XRD two-theta trace of the powder taken from the BZT target in accordance with the present invention. A chip from the BZT target was ground up and a powder-diffraction sample was prepared. This plot shows a random oriented, fine grain and well-crystallized perovskite pattern consistent with the desired bulk material.

Returning to the FIG. 1, a BZT thin film is then deposited on top of a sample, e.g., substrate, by using conventional rf diode or magnetron sputter deposition in a low pressure inert gas without any oxygen added to the working gas, wherein the substrate may include electrical circuit elements or any other structures. In the above sputter-deposition, the pressure is 3–50 mTorr, the inert gas is typically Ar, Ne or Kr, and the sample was configured directly opposite the sputter-target at a distance of 4–30 cm and was oriented paralleled to the plane of the sputter-target. When the crystal structure of the BZT thin film was analyzed using XRD, the BZT thin film deposited at 200–300° C. showed some mild evidence of the perovskite crystal structure. This structure would normally not be present in the conventionally deposited BZT thin film at these temperatures due to the lack of adequate oxygen in the conventionally deposited BZT thin film.

Figure 4A:
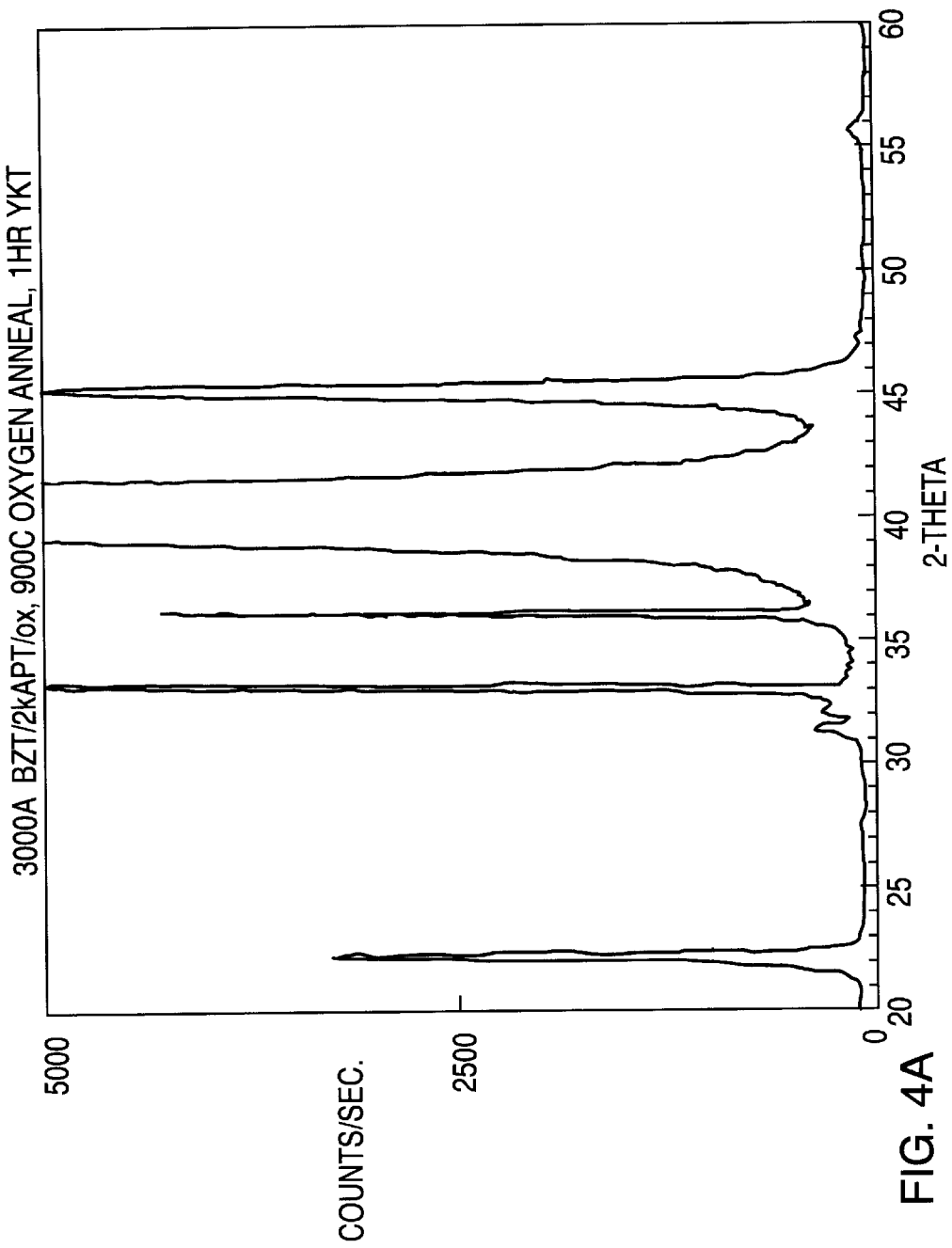
FIG. 4A and 4B are plots providing XRD two-theta traces of 3000 angstrom thick BZT film deposited on Pt which have been annealed in oxygen and nitrogen for 1 hour at 900° C., respectively.
Figure 4B:
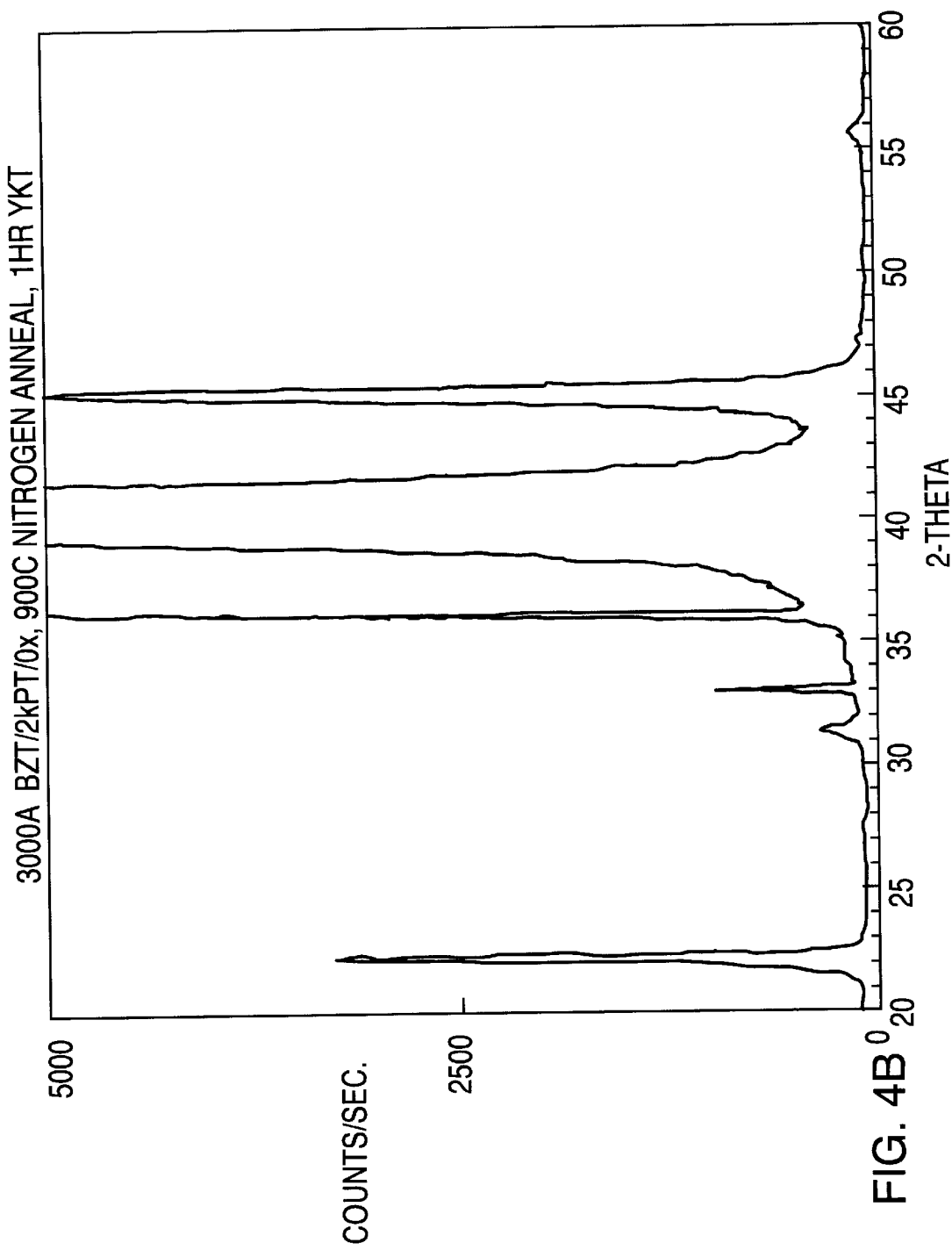

Finally, the BZT thin film is annealed at a temperature of at least 650° C., preferably higher to increase the dielectric constant. The annealing step is done in a variety of ambient gases and conditions, e.g., in flowing nitrogen, helium, and under vacuum. Since the BZT thin film is deposited in a fully oxidized form, it is unnecessary to provide oxygen during the annealing step. In addition, an additional metal layer of Pt is sputter-deposited on top of the BZT thin film, encapsulating it and preventing exposure of the BZT thin film to the ambient gas during annealing. It is found that the BZT thin film is characterized by high dielectric constants consistent with fully stoichiometric, well crystallized films. For examples, FIG. 4A and 4B are plots providing XRD two-theta traces of 3000 angstrom thick BZT film deposited on Pt which have been annealed in oxygen and nitrogen for 1 hour at 900° C., respectively.

Having described and illustrated the principles of the invention in a preferred embodiment thereof, it is appreciated by those having skill in the art that the invention can be modified in arrangement and detail without departing from such principles. For example, the BZT thin film is desirably fabricated with the method of the present invention, but the method is not limited to fabrication of thin films using those compounds. Any other type of material, e.g., $BaTiO_3$, PZT, PLZT, SBT, or other titanates, can be fabricated using the inventive sputter-target fully oxidized and crystallized to the perovskite structure, although the method of the present invention may not confer any benefits for some of these material.

As previously mentioned, the present invention provides the sputter deposition with the target comprising material which has been fully oxidized and crystallized into the perovskite structure, to reduce the negative ion effect during the sputter deposition, resulting in good control of thin film composition without deleterious effects caused by resputtering, and in obtaining high deposition rates and the ability to use conventional geometries, that is, sample-facing target, consistent with manufacturing applications.

Furthermore, the deposition of fully oxidized film allows the use of an oxygen-free annealing step, eliminating the need for an oxygen diffusion barrier and reducing potential damage to underlying, easily-oxidized circuit elements or structure.

While the present invention has been described with respect to certain preferred embodiments only, other modifications and variations may be made without departing from the scope of the present invention as set forth in the following claims.

What is claimed is:

1. A method for sputter-depositing a thin film comprising the steps of:

forming a sputter-target of a material which is a fully oxidized perovskite by
   sintering a powder into a bulk starting material in an oxygen ambient;
regrounding the bulk starting material;
hot pressing the regrounded material to a sputter-target of a disk shape in an inert embodiment; and
bonding the sputter-target to a backing plate;

depositing a perovskite thin film on top of a substrate by using a sputtering method with said sputter-target in an inert gas; and
annealing the perovskite thin film in a non-oxygen ambient.

2. The method of claim 1, wherein the material of the sputter-target includes $BaTiO_3$, BZT, BST, PZT, PLZT, SBT or other titanate.

3. The method of claim 1, wherein the sintering step is carried out at a temperature of over 900° C.

4. The method of claim 1, wherein the inert ambient of the hot pressing step includes nitrogen or argon.

5. The method of claim 1, wherein the sputter-depositing step is carried out at a pressure of 3–50 mTorr.

6. The method of claim 1, wherein the inert gas of the sputter-depositing step includes argon, neon or krypton.

7. The method of claim 1, wherein the substrate is configured directly opposite the sputter-target at a distance of 4 to 30 cm and is oriented parallel to the plane of the sputter-target.

8. The method of claim 1, wherein the annealing step is undertaken in flowing nitrogen or helium, or under vacuum.

9. The method of claim 1 further comprising a step of depositing a metal layer on top of the thin film before the annealing step.

10. A method for forming a BZT thin film comprising the steps of:

sintering a BZT powder into a bulk BZT material in the presence of oxygen, the bulk BZT material being fully oxidized and crystallized to a perovskite structure;
regrounding and hot pressing the bulk BZT material into a sputter-target of a disk shape in an inert ambient, wherein the target retains the perovskite structure;
bonding the target to a backing plate;
sputter-depositing a BZT thin film on top of a substrate using the target in an inert gas; and
annealing the BZT thin film in non-oxygen ambient.

11. The method of claim 10, wherein the substrate is configured directly opposite the sputter-target at a distance of 4 to 30 cm and is oriented parallel to the plane of the sputter-target.

12. The method of claim 10, wherein the sintering step is carried out at a temperature of over 900° C.

13. The method of claim 10, wherein the inert ambient of the hot pressing step includes nitrogen or argon.

14. A method for forming a sputter-target made of a titanate comprising the steps of:

sintering a powder into a bulk titanate in an oxygen ambient;
regrounding the bulk titanate; and
hot pressing the regrounded titanate to a sputter-target of a disk shape in an inert ambient.

15. The method of claim 14, wherein the titanate of the sputter-target includes $BaTiO_3$, BZT, BST, PZT, PLZT or SBT.

16. The method of claim 14, wherein the sintering step is carried out at a temperature of over 900° C.

17. The method of claim 14, wherein the inert ambient of the hot pressing step includes nitrogen or argon.

* * * * *